(12) United States Patent
Tsai

(10) Patent No.: US 7,198,501 B1
(45) Date of Patent: Apr. 3, 2007

(54) LATERAL ENGAGING STRUCTURE OF AN ELECTRICAL CONNECTOR

(76) Inventor: Chou Hsuan Tsai, 15F, No. 4, Lane 127, Sec. 1, Fu-Hsing Rd., Hsin-Chuang City, Taipei Hsien (TW)

( * ) Notice: Subject to any disclaimer, the term of this patent is extended or adjusted under 35 U.S.C. 154(b) by 0 days.

(21) Appl. No.: 11/527,344

(22) Filed: Sep. 26, 2006

(51) Int. Cl.
  *H01R 13/62* (2006.01)
(52) U.S. Cl. ........................ 439/326; 439/328
(58) Field of Classification Search .......... 439/326, 439/327, 328, 630, 631, 636, 637
  See application file for complete search history.

(56) References Cited

U.S. PATENT DOCUMENTS

| | | | | |
|---|---|---|---|---|
| 5,803,761 A | * | 9/1998 | Mochizuki | 439/326 |
| 6,146,177 A | * | 11/2000 | Wu | 439/326 |
| 6,419,513 B1 | * | 7/2002 | Choy | 439/326 |
| 6,743,028 B2 | * | 6/2004 | Wang | 439/92 |
| 7,048,565 B2 | * | 5/2006 | Lin | 439/326 |
| 2004/0248451 A1 | * | 12/2004 | Lee | 439/328 |

* cited by examiner

*Primary Examiner*—Hien Vu
(74) *Attorney, Agent, or Firm*—Pro-Techtor Int'l Services

(57) ABSTRACT

A lateral engaging structure of an electrical connector is disposed at one side of a plastic base of the connector to engage with an inserted circuit board. The structure includes a main body and an elastic arm. The main body has vertical first and transversal plates. The first plate is connected to the plastic base. The transversal plate is disposed at a front end of the first plate and extends in a direction perpendicular to the first plate. The transversal plate is formed with a step including a first surface, a second surface and a vertical stopping surface. The elastic arm has a rear end connected to the first plate, a front section engaging with the circuit board, and a front end formed with a stopping portion, which protrudes forward and is disposed below the first surface.

9 Claims, 8 Drawing Sheets

LATERAL ENGAGING STRUCTURE OF AN ELECTRICAL CONNECTOR

BACKGROUND OF THE INVENTION

1. Field of the Invention

The invention relates to a lateral engaging structure, and more particularly to a lateral engaging structure of an electrical connector.

2. Description of the Related Art

As shown in FIGS. 1 and 2, a conventional electrical connector to be connected to a circuit board includes a plastic base 11, a plurality of terminals 15 and two lateral engaging structures 20. The terminals 15 are disposed in the plastic base 11. Each terminal 15 has a pin 16 extending out of front and rear ends of the plastic base 11. One end of the lateral engaging structure 20 is fixed to one of two sides of the plastic base 11. The lateral engaging structure 20 has a vertical plate 21 and a horizontal plate 22 perpendicular to each other. Only the rear end of the vertical plate 21 is connected to the horizontal plate 22 such that the front end of the vertical plate 21 becomes a free end that can elastically move leftward or rightward. The front section of the vertical plate 21 has a handle 23 and a laterally protruding arced portion 24 and an engaging portion 25. The front section of the horizontal plate 22 is formed with a positioning surface 26 and a stopping portion 27.

When the circuit board 28 is inserted for connection, engagement holes 29 at two sides thereof may engage with the arced portions 24 of the lateral engaging structures 20 and the engaging portions 25 engage with the circuit board 28 so that the circuit board 28 can be positioned firmly. When the two lateral engaging structures 20 are moved outward, the engaging portions 25 are separated from the circuit board 28. The circuit board 28 is ejected upward by the resilience of the terminal 15, and can be thus taken out.

The conventional lateral engaging structures 20 for positioning the circuit board 28 have the following drawbacks. After the circuit board 28 is fixed and when a lateral impact force is applied for test, the vertical plate 21 elastically moves due to the impact force. When the engaging portion 25 is separated from the circuit board 28, the circuit board jumps away. So, the conventional electrical connector cannot withstand the larger lateral impact force.

SUMMARY OF THE INVENTION

It is therefore an object of the invention to provide a lateral engaging structure of an electrical connector, which can laterally position an elastic arm so as to resist the lateral impact force when positioning a circuit board.

To achieve the above-identified object, the invention provides a lateral engaging structure of an electrical connector. The electrical connector has a plastic base. The lateral engaging structure is disposed at one side of the plastic base to engage with a lateral side of a circuit board inserted into the electrical connector. The lateral engaging structure includes a main body and an elastic arm. The main body has a first plate and a transversal plate, both of which have vertical plate surfaces. A rear end of the first plate is connected to one side of the plastic base. The transversal plate is disposed at a front end of the first plate and extends in an extending direction substantially perpendicular to the first plate. A lower edge of the transversal plate is formed with a step having a first surface, a second surface lower than the first surface, and a vertical stopping surface between the first surface and the second surface. The elastic arm has a vertical plate surface, a rear end connected to the first plate of the main body, and a front end that is a free end. The elastic arm extends from back to front and slightly toward the circuit board. A front section of the elastic arm engages with one side of the circuit board. A front end of the elastic arm is formed with a stopping portion protruding forward. The stopping portion is located under the first surface of the transversal plate. The stopping portion stops on a stopping surface of the transversal plate and the front section of the elastic arm still engages with the circuit board when the elastic arm elastically moves toward the first plate. The elastic arm disengages from the circuit board when the elastic arm is pressed down to make the stopping portion pass under the second surface of the transversal plate.

According to the above-mentioned structure, when the elastic arm elastically moves under the action of the lateral force, the stopping portion rests against the stopping surface of the transversal plate and the front section of the elastic arm still engages with the circuit board. Thus, the circuit board can be firmly positioned.

Other objects, features, and advantages of the invention will become apparent from the following detailed description of the preferred but non-limiting embodiments. The following description is made with reference to the accompanying drawings.

DETAILED DESCRIPTION OF THE INVENTION

Figures 1, 2:
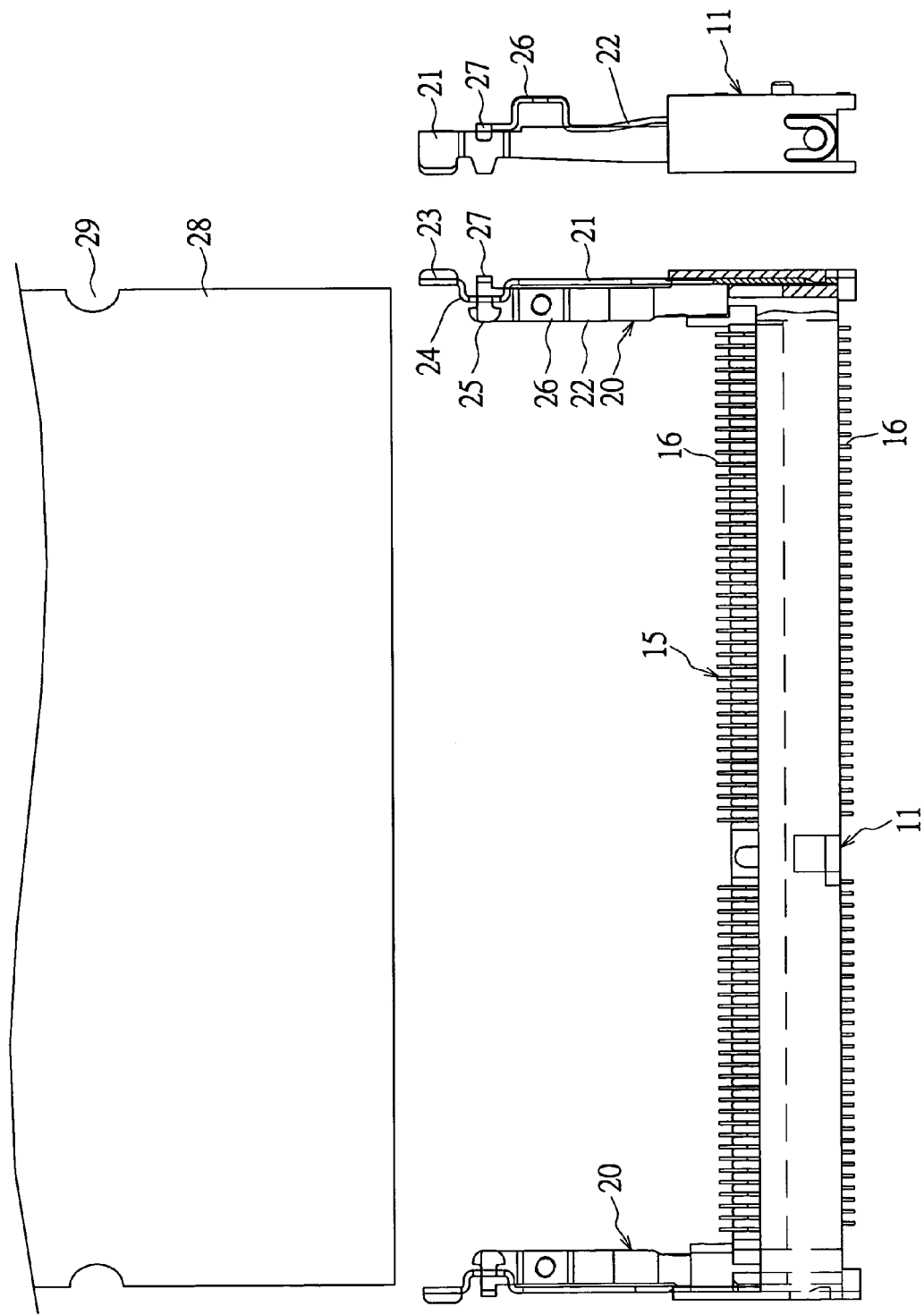
FIG. 1 is a top view showing a conventional electrical connector.
FIG. 2 is a side view showing the conventional electrical connector.
Figure 3:
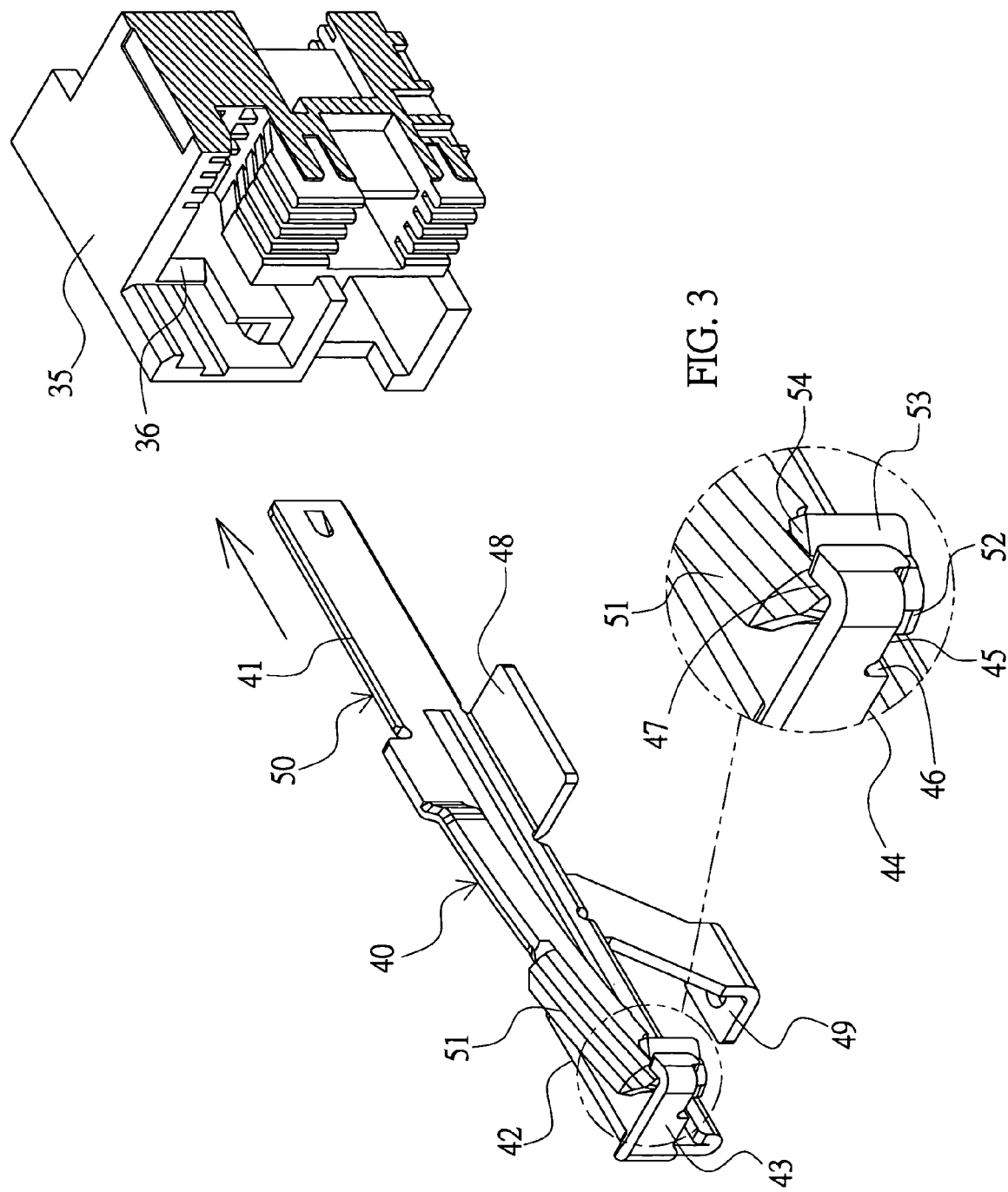
FIG. 3 is a pictorially exploded view showing a lateral engaging structure according to a preferred embodiment of the invention.
Figure 4:
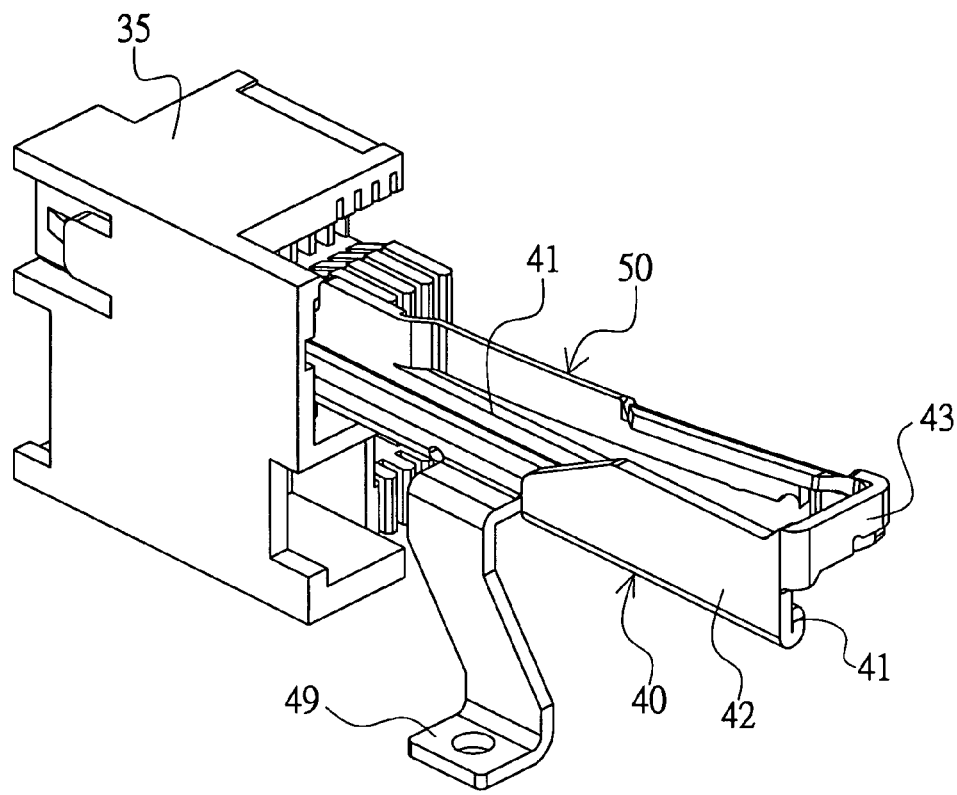
FIG. 4 is a pictorially assembled view showing the lateral engaging structure according to the preferred embodiment of the invention.
Figure 5:
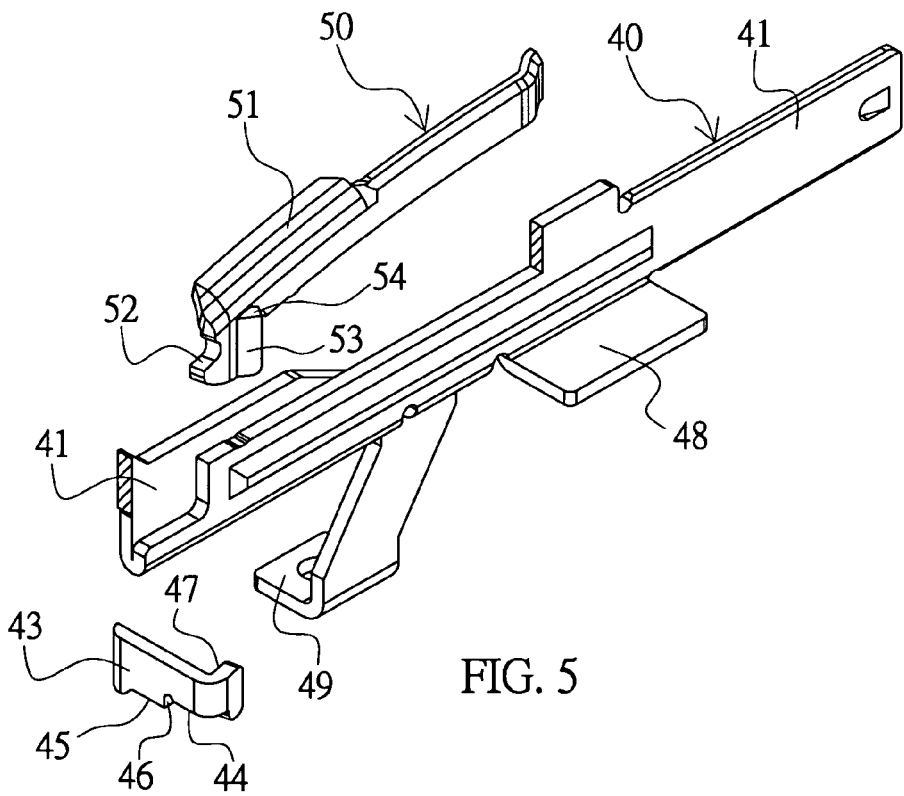
FIG. 5 is a pictorially exploded view showing a broken-out section of the lateral engaging structure according to the preferred embodiment of the invention.

As shown in FIGS. 3 to 5, a lateral engaging structure of an electrical connector of the invention is disposed on a lateral side of a plastic base 35 of the electrical connector to engage with a lateral side (see FIG. 6) of a circuit board 38 inserted into the electrical connector. The lateral engaging structure includes a main body 40 and an elastic arm 50.

The main body 40 has a first plate 41, a second plate 42 and a transversal plate 43 each having a vertical plate surface. The rear end of the first plate 41 is connected to a connection portion 36 at one side of the plastic base 35. The second plate 42 is connected to and folded with the first plate 41. One end of the transversal plate 43 is connected to a front end of the second plate 42. The one end of the transversal plate 43 is bent to form at the front end of the first plate 41 and extends in an extending direction perpendicular to the first plate 41. The other end of the transversal plate 43 is further bent frontward to form a lateral resting plate 47 such that the transversal plate 43 has an L-shape. The lower edge of the transversal plate 43 is formed with a step having a first surface 44, a second surface 45 lower than the first surface 44, and a vertical stopping surface 46 between the first surface 44 and the second surface 45. In addition, the lower edge of the first plate 41 is formed with a horizontal supporting sheet 48 and a fixing sheet 49 that extends downward.

Figure 6:
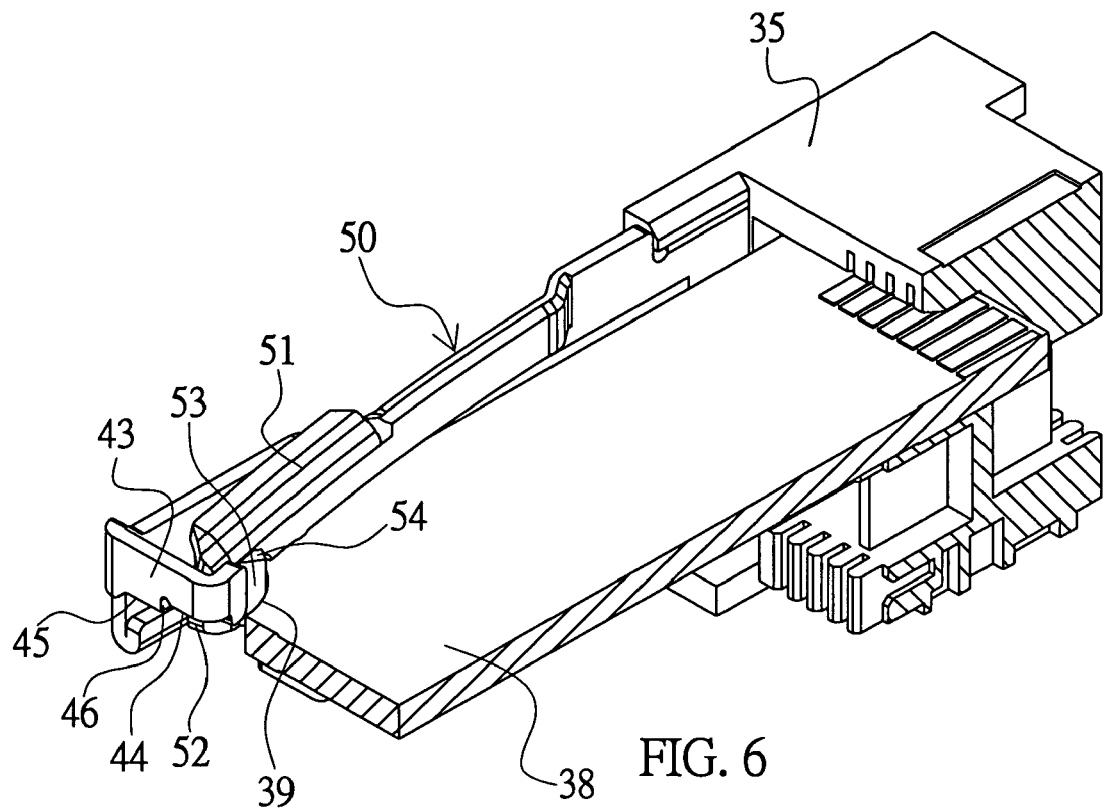
FIG. 6 is a pictorial view showing the lateral engaging structure, which engages with a circuit board, according to the preferred embodiment of the invention.
Figure 7:
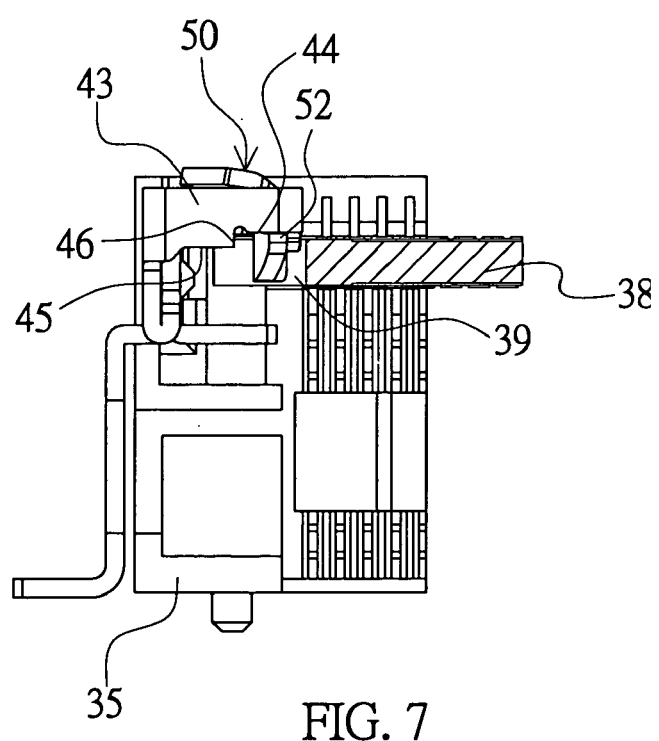
FIG. 7 is a front view showing the lateral engaging structure, which engages with the circuit board, according to the preferred embodiment of the invention.

As shown in FIGS. 6 and 7, the elastic arm 50 and the first plate 41 of the main body 40 are formed by tearing the same plate body. The rear end of the elastic arm 50 is connected to the first plate 41 of the main body and the front end of the elastic arm 50 is a free end. So, the plate surface of the elastic arm is also vertical. The elastic arm 50 extends from back to front and slightly toward the circuit board 38 such that the front section of the elastic arm 50 engages with one side of the circuit board 38 and rests against a resting plate 47 of the transversal plate 43. The front section of the elastic arm 50 is formed with a laterally slanting handle 51, a stopping portion 52 protruding forward and a laterally protruding stopping block 53. The handle 51 facilitates the actuating of a finger and the guiding-in of the circuit board. The stopping portion 52 is disposed under the first surface 44 of the transversal plate 43. When the elastic arm 50 elastically moves toward the first plate 41, the stopping portion 52 stops on the stopping surface 46 of the transversal plate 43, the stopping block 53 can engage with an engagement hole 39 of the circuit board 38. The top end of the stopping block 53 has a horizontal surface 54. When the circuit board is not completely inserted into the electrical connector, the circuit board presses against the horizontal surface at the top end of the stopping block 53 and cannot be pressed down. That is, the circuit board has to be completely inserted into the electrical connector to get rid of the stopping block 53 through the engagement hole 39.

Figure 8:
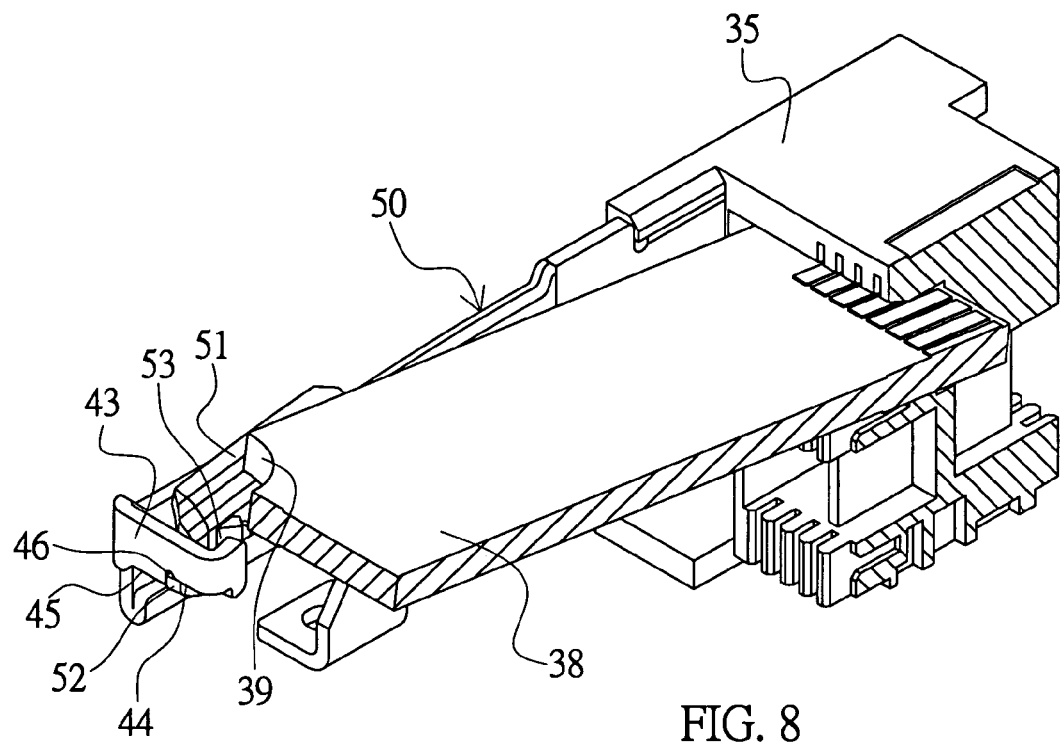
FIG. 8 is a pictorial view showing a first operation of the lateral engaging structure, into which the circuit board is inserted, according to the preferred embodiment of the invention.
Figure 9:
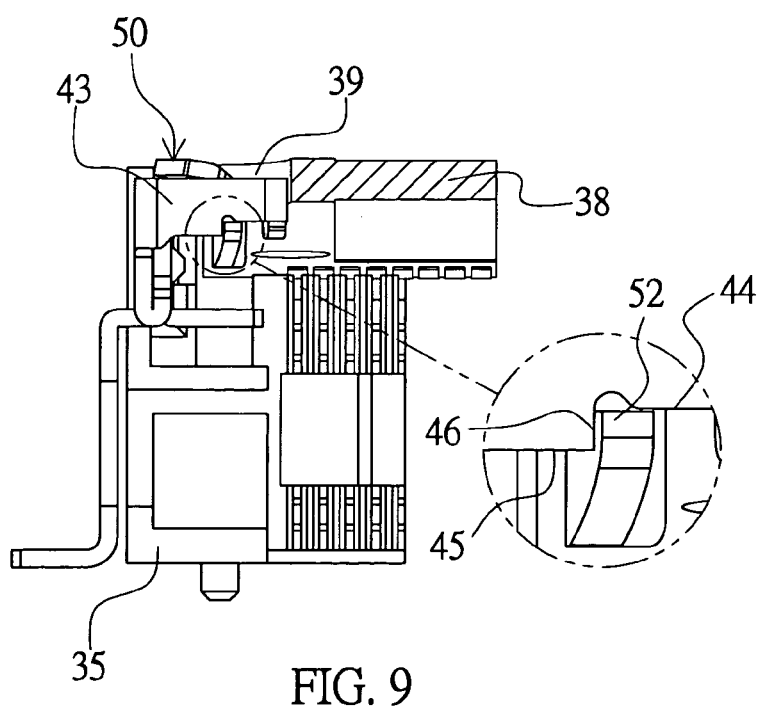
FIG. 9 is a front view showing the first operation of the lateral engaging structure, into which the circuit board is inserted, according to the preferred embodiment of the invention.
Figure 10:
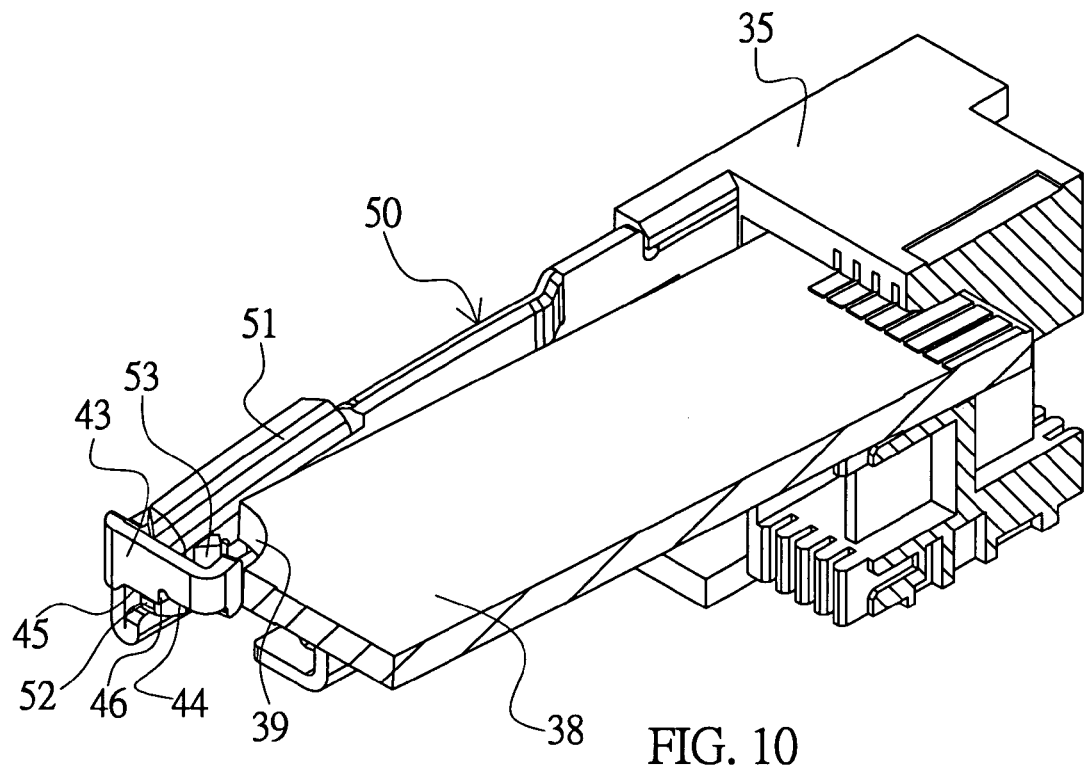
FIG. 10 is a pictorial view showing a second operation of the lateral engaging structure, into which the circuit board is inserted, according to the preferred embodiment of the invention.
Figure 11:
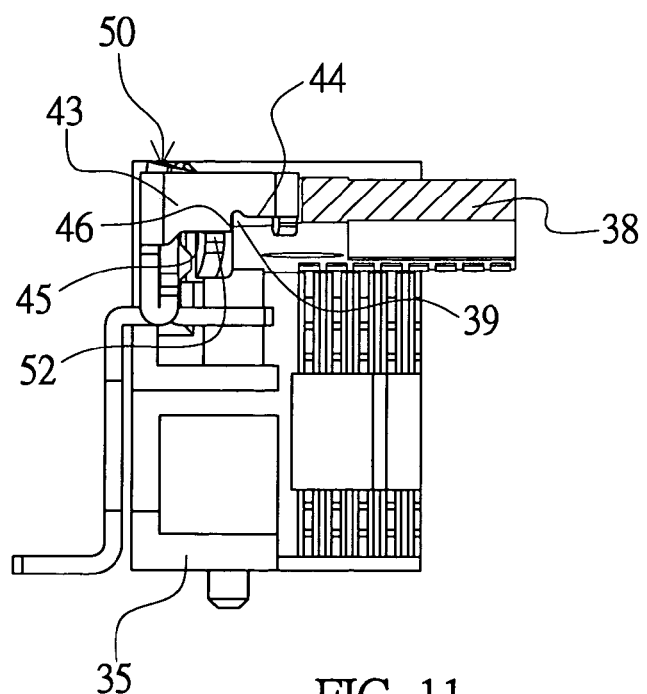
FIG. 11 is a front view showing the second operation of the lateral engaging structure, into which the circuit board is inserted, according to the preferred embodiment of the invention.

As shown in FIGS. 8 and 9, when the circuit board 38 is slantingly inserted into the electrical connector to be pressed down for positioning, the circuit board 38 first presses the handle 51 of the elastic arm 50 to move the elastic arm 50 toward the first plate 41 elastically, and the stopping portion 52 stops on the stopping surface 46 of the transversal plate 43. As shown in FIGS. 10 and 11, when the circuit board 38 is continuously pressed down, the elastic arm 50 is pressed down to enable the stopping portion 52 to pass under the second surface 45 of the transversal plate 43. Thus, the elastic arm 50 can elastically move toward the first plate 41. As shown in FIGS. 6 and 7, when the circuit board 38 is continuously pressed down to the positioning location, the circuit board 38 is separated from the inclined surface of the handle 51, so the elastic arm 50 bounces back and engages with the circuit board. The stopping block 53 engages with the engagement hole 39 of the circuit board 38 to block the circuit board 38 and disable the circuit board 38 from being moved forward and separated from the electrical connector.

Figure 12:
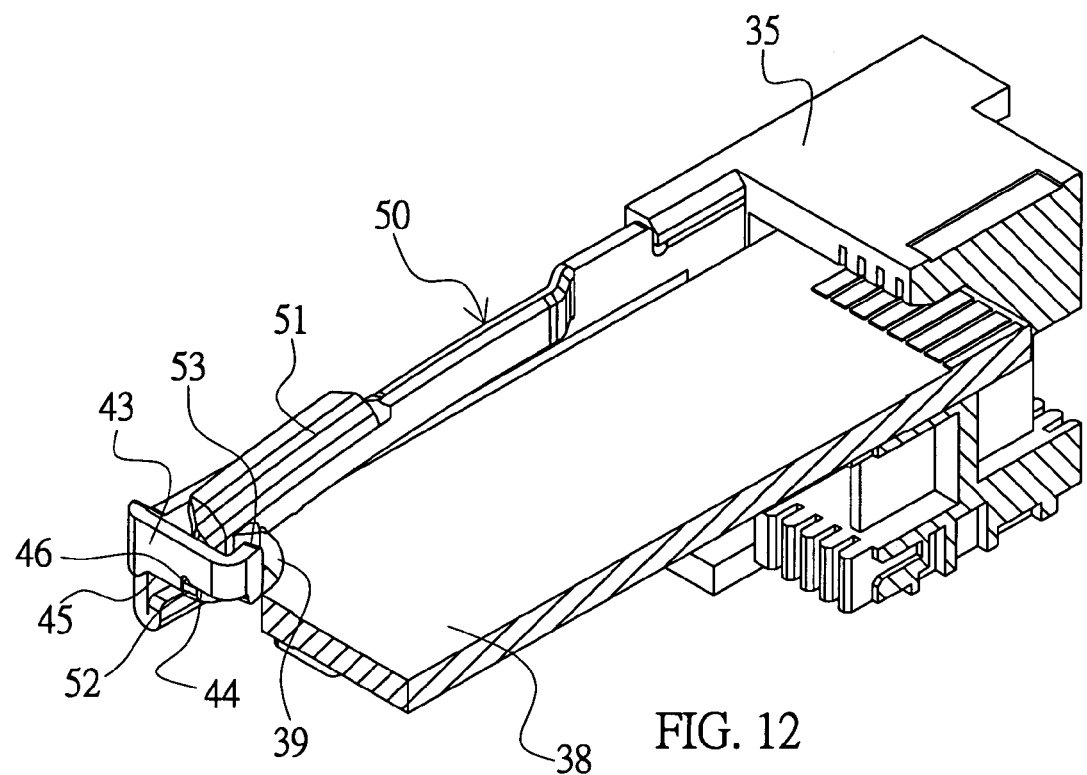
FIG. 12 is a pictorial view showing the first operation of the lateral engaging structure, from which the circuit board is removed, according to the preferred embodiment of the invention.
Figure 13:
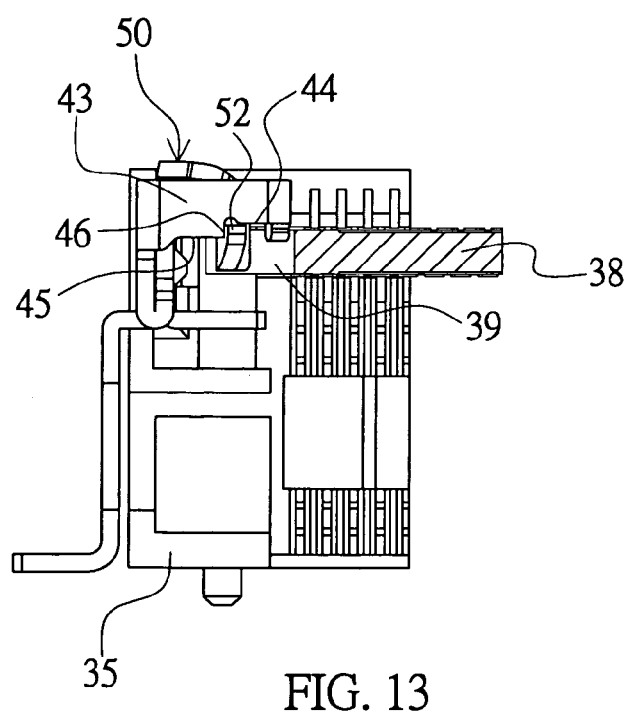
FIG. 13 is a front view showing the first operation of the lateral engaging structure, from which the circuit board is removed, according to the preferred embodiment of the invention.
Figure 14:
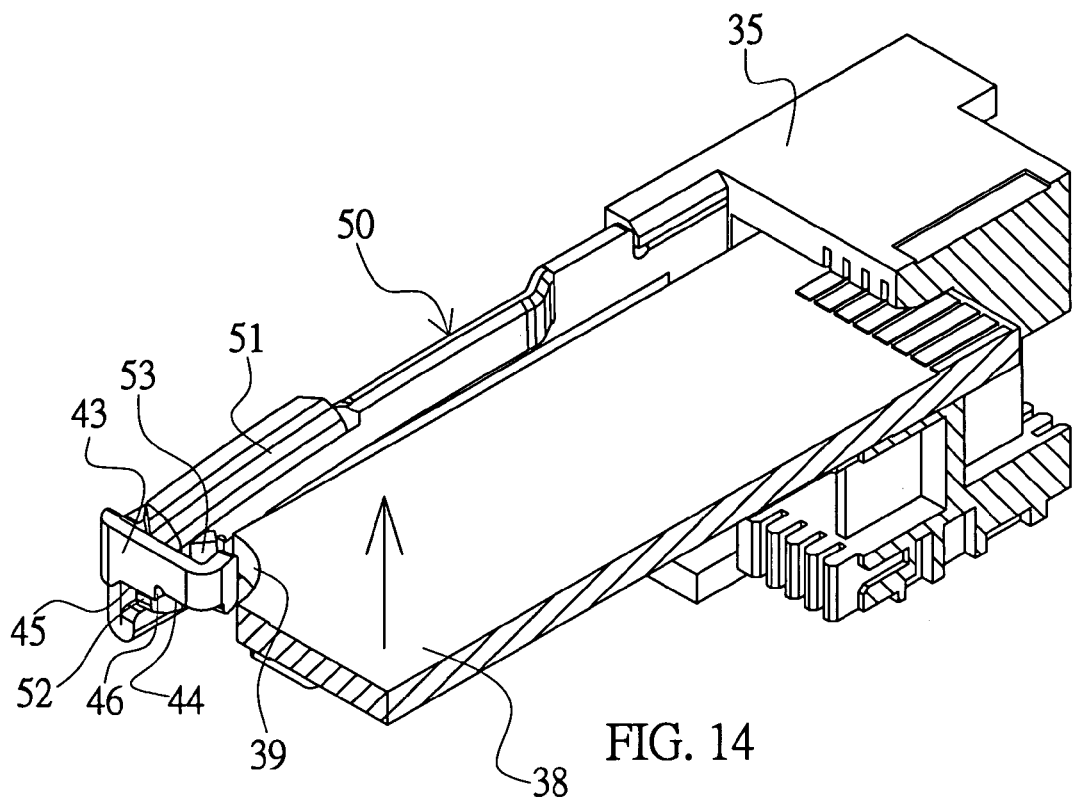
FIG. 14 is a pictorial view showing the second operation of the lateral engaging structure, from which the circuit board is removed, according to the preferred embodiment of the invention.
Figure 15:
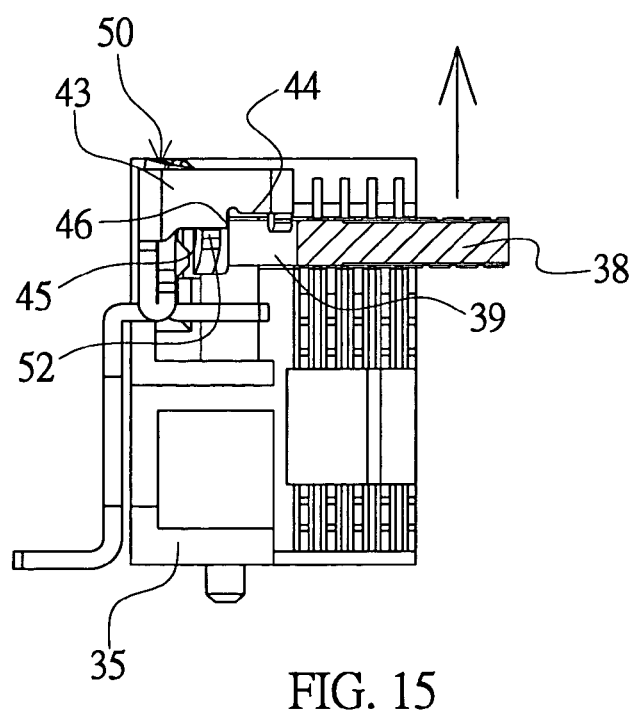
FIG. 15 is a front view showing the second operation of the lateral engaging structure, from which the circuit board is removed, according to the preferred embodiment of the invention.

The operation of inserting the circuit board 38 has been described hereinabove. As shown in FIGS. 12 and 13, if the circuit board 38 is to be taken out, the finger moves the handle 51 of the elastic arm 50 toward the first plate 41. At this time, the stopping portion 52 rests against the stopping surface 46 of the transversal plate 43, and the front section of the elastic arm 50 still engages with the circuit board. As shown in FIGS. 14 and 15, the elastic arm 50 is slightly pressed down such that the stopping portion 52 thereof passes under the second surface 45 of the transversal plate 43 and disengages from the circuit board 38. At this time, the circuit board 38 can disengage from the front section of the elastic arm 50 and jump away such that it can be taken out. Although a downward pressing operation has to be performed, the operation will never become inconvenient. Because the downward pressing stroke in the invention is very short, a downward pressing component is naturally generated as the handle of the elastic arm is moved. So, when the stopping portion 52 of the elastic arm 50 is blocked by the stopping surface 46 of the transversal plate 43, it naturally moves downward to the position under the second surface 45 and then moves laterally, and the operation is thus very smooth.

When the lateral impact force is used for test, as shown in FIGS. 12 and 13, the elastic arm 50 is moved laterally due to the lateral impact force, and the stopping portion 52 of the elastic arm is blocked by the stopping surface 46 of the transversal plate 43 and cannot be moved laterally again. At this time, the front section of the elastic arm 50 still engages with the circuit board 38, so the circuit board 38 cannot jump away due to the lateral force.

When a vertical impact force is used for test, the circuit board 38 cannot be shifted due to the vertical impact force because the elastic arm 50 engages with the circuit board 38 and the supporting sheet 48 supports the circuit board 38 upward.

As mentioned hereinabove, the circuit board 38 can be firmly positioned using the invention structure when either the vertical impact force or the lateral impact force is applied. In particular, the movement of the elastic arm 50 caused by the lateral impact force still enables the elastic arm 50 to engage with the circuit board 38, thereby solving the problem of the prior art difficulty of resisting the lateral impact force.

In addition, the horizontal surface 54 at the top of the stopping block 53 can prevent the improper operation of the circuit board 38, which is not completely inserted into the electrical connector, such that the user can correct the circuit board to the correct inserting depth.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A lateral engaging structure of an electrical connector, the electrical connector having a plastic base, the lateral engaging structure being disposed at one side of the plastic base to engage with a lateral side of a circuit board inserted into the electrical connector, the lateral engaging structure comprising:

a main body having a first plate and a transversal plate, both of which have vertical plate surfaces, wherein a rear end of the first plate is connected to the one side of the plastic base, the transversal plate is disposed at a front end of the first plate and extends in an extending direction substantially perpendicular to the first plate, a lower edge of the transversal plate is formed with a step having a first surface, a second surface lower than the first surface, and a vertical stopping surface between the first surface and the second surface; and an elastic arm, which has a vertical plate surface, a rear end connected to the first plate of the main body, and a front end that is a free end, wherein the elastic arm extends from back to front and slightly toward the circuit board, a front section of the elastic arm engages with one side of the circuit board, the front end of the elastic arm is formed with a stopping portion protruding forward, the stopping portion is located under the first surface of the transversal plate, the stopping portion stops on a stopping surface of the transversal plate and the front section of the elastic arm still engages with the circuit board when the elastic arm elastically moves toward the first plate, and the elastic arm disengages from the circuit board when the elastic arm is pressed down to make the stopping portion pass under the second surface of the transversal plate.

2. The lateral engaging structure according to claim 1, wherein the front section of the elastic arm is formed with a laterally slanting handle to facilitate actuating of a finger and guiding-in of the circuit board.

3. The lateral engaging structure according to claim 1, wherein one end of the transversal plate is bent frontward and formed with a lateral resting plate to make the transversal plate have an L-shape, and the front section of the elastic arm rests against the resting plate.

4. The lateral engaging structure according to claim 1, wherein the main body has a vertical second plate folded with the first plate, and the transversal plate is connected to the second plate and is formed by way of bending.

5. The lateral engaging structure according to claim 1, wherein the main body has a fixing sheet extending downward.

6. The lateral engaging structure according to claim 1, wherein the front section of the elastic arm is formed with a laterally protruding stopping block, which may engage with an engagement hole formed at the one side of the circuit board.

7. The lateral engaging structure according to claim 6, wherein a top end of the stopping block of the elastic arm is formed with a horizontal surface.

8. The lateral engaging structure according to claim 1, wherein the elastic arm and the first plate of the main body are formed by tearing a plate body.

9. The lateral engaging structure according to claim 1, wherein a lower edge of the first plate of the main body is formed with a horizontal supporting sheet for supporting the circuit board to prevent the circuit board from sinking.

* * * * *